United States Patent [19]

Weber

[11] 4,153,149

[45] May 8, 1979

[54] ADJUSTING KNOB DEVICE FOR ELECTRICAL INSTRUMENTS AND THE LIKE

[75] Inventor: Eugen Weber, Hinwil, Switzerland

[73] Assignees: Orbisphere Corporation, Wilmington; Succursale de Collonge-Bellerive, Manoir de Bonvent, Collonge-Bellerive, Switzerland

[21] Appl. No.: 871,630

[22] Filed: Jan. 23, 1978

[30] Foreign Application Priority Data

Feb. 1, 1977 [CH] Switzerland ................ 1169/77

[51] Int. Cl.² ................ F16D 23/00; G05G 11/00
[52] U.S. Cl. ................ 192/95; 74/553; 361/288
[58] Field of Search ......... 73/431; 116/124 A, 129 B; 200/336; 361/288; 74/483 PB, 553; 338/166; 192/95

[56] References Cited

U.S. PATENT DOCUMENTS

| | | | |
|---|---|---|---|
| 2,704,466 | 3/1955 | Way | 74/553 X |
| 2,809,262 | 10/1957 | Protz | 200/302 |
| 2,927,168 | 3/1960 | Brown | 74/553 X |
| 2,968,779 | 1/1961 | Goode et al. | 338/166 |
| 2,984,726 | 5/1961 | Roeser | 74/18.1 X |
| 3,333,079 | 7/1967 | Michaelson, Jr. | 200/336 |
| 3,384,727 | 5/1968 | Zarertnik et al. | 200/302 X |
| 3,528,315 | 9/1970 | Marquis | 74/553 |
| 3,797,630 | 3/1974 | Zilkha | 361/288 |
| 3,986,409 | 10/1976 | Tripp et al. | 74/553 |

*Primary Examiner*—Daniel M. Yasich
*Attorney, Agent, or Firm*—Werner W. Kleeman

[57] ABSTRACT

A sealed adjusting device for mounting in the wall of a sealed instrument housing that includes at least one adjustable element, such as a potentiometer. The adjusting device comprises an elongated sleeve-like mounting hub capable of being sealingly secured in the housing wall, and a normally freely rotatable or freely turnable knob structured as a hollow capsule rotatably inserted onto one end of the mounting hub. The other end of the mounting hub receives or is connected with a portion of the adjustable element. A spring is provided within the mounting hub to hold the knob in its freely turnable or rotatable position. The knob is operatively connected with a clutch-sleeve for temporary engagement with the rotatable operating end of the adjustable element when the knob is pushed against the spring. The knob has a recessed portion fitted with the corresponding outer end portion of the mounting hub and an O-ring is provided between the knob and the mounting hub so as to seal the device and to protect the interior components from contact with water or other contaminants.

5 Claims, 1 Drawing Figure

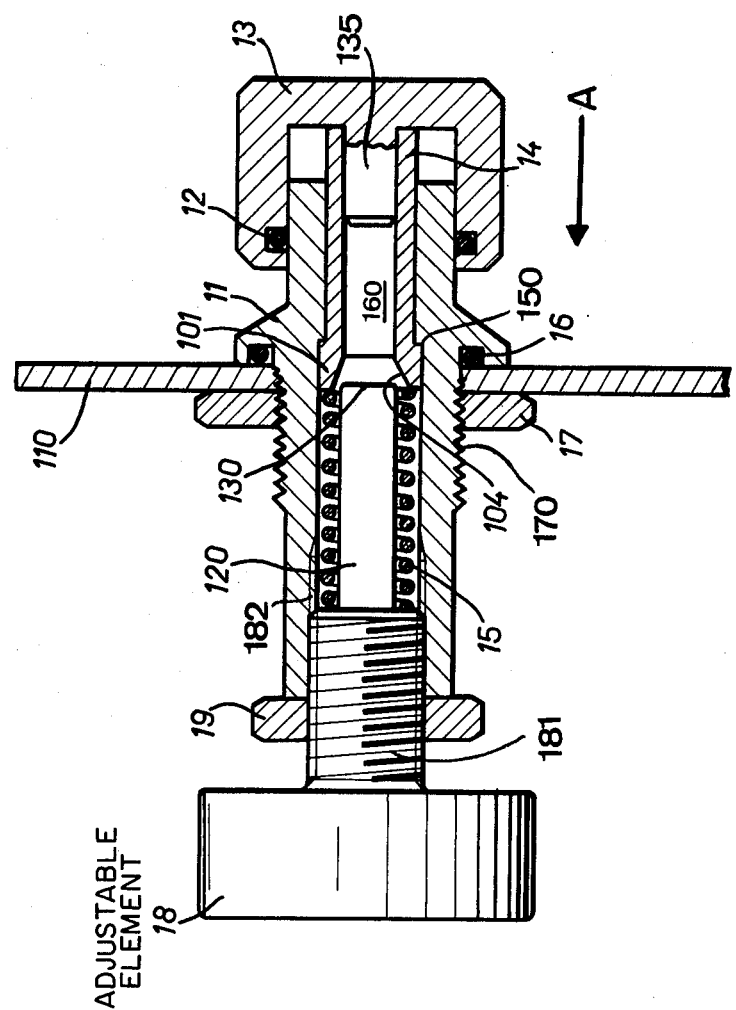

ADJUSTING KNOB DEVICE FOR ELECTRICAL INSTRUMENTS AND THE LIKE

BACKGROUND OF THE INVENTION

(1) Field of the Invention

The present invention relates to control and adjustment means of the type used in electrical instruments and more particularly to a sealed adjusting device having a normally freely turnable or rotatable setting knob that can be actuated temporarily by manual pressure for engagement with an adjustable element so as to change the setting thereof, e.g. for calibrating an electronic or electrical measuring apparatus or for zero-adjustment thereof.

Monitoring and measurement of environmental parameters that have an ecological significance is a problem of growing importance, i.e. to determine the concentration of undesirable components or pollutants in the air or in water; electrical or electronic instruments having a very high sensitivity are required for these purposes. Frequently, such instruments are used under operating conditions that involve contact with water, moisture and other environmental hazards for sensitive instruments, e.g. portable instruments for gas-analytical or limnological measurements.

Frequently, such instruments require a calibration setting or zero-adjustment prior to commencing the actual measuring operation and such adjustment or setting must not be changed unintentionally during operation, i.e. it must be protected against displacement by hazard or mistake.

(2) Description of the Prior Art

Prior art adjustment devices that would be suitable for preventing an accidental change of the setting or adjustment of an instrument are known, such as the device disclosed in German patent application DE-OS No. 1,260,003, but are not generally suitable for use in an unprotected environment; complicated and, hence, costly structural changes would be required to adapt such devices for sealed operation.

Accordingly, it is the main object of this invention to provide for an adjusting device of a simple structure that precludes accidental changes of the setting or adjustment of an instrument while at the same time effectively preventing penetration of water or contaminants into an instrument housing provided with such an adjusting device.

SUMMARY OF THE INVENTION

The adjusting device according to the invention comprises a normally freely turnable or freely rotatable setting knob capable of being temporarily activated by manual pressure for changing the setting or adjustment of an associated adjustable element and is characterized by a setting knob in the form of a hollow capsule rotatably arranged at one end of a stationary mounting hub of a generally sleeve-like structure, a seal being provided between the inner side of the knob and the mounting hub near the open end of the knob for protecting the interior of the mounting hub against penetration of water and against contamination.

BRIEF DESCRIPTION OF THE DRAWING

The sole FIGURE in the drawing is a sectional view of a preferred embodiment of the adjusting device according to the invention with an associated adjustable element and a broken-away portion of an instrument housing.

DESCRIPTION OF THE PREFERRED EMBODIMENT

Referring to the drawing, the adjusting device comprises a stationary sleeve socket or mounting hub 11 having a generally tubular structure and serving, inter alia, to secure the device in a panel or wall portion 110 of a housing, e.g. a sealed housing of an electronic instrument. For water-proof mounting in panel 110, mounting hub 11 has a threaded outer portion 170 and is pressed by means of a nut 17 that engages with threaded outer portion 170 against the interior surface of panel 110. An O-ring 16 is provided between the outer surface of panel 110 and hub 11 and forms a seal thereinbetween when nut 17 is screwed on threaded outer portion 170 against panel 110. A rotatably adjustable element 18, e.g. a conventional potentiometer, a conventional variable capacitor or the like (the electrical connections of which have been omitted in the drawing), is provided within the casing enclosed by panel 110. Direct attachment of element 18 in the mounting hub 11 is preferred, e.g. by means of an outer thread socket 181 for engagement with an inner threaded portion 182 in mounting hub 11 at that side thereof which extends into the casing defined by panel 110 and blocking the position of the threaded-in element 18 by means of a lock-nut 19.

However, such direct attachment of the adjustable element on the inventive adjusting device is preferable from a practical point of view but is not believed to be critical as the adjustable element 18 might as well be supported by another structure enclosed by panel 110 or by the panel itself, e.g. via a bracket (not shown).

In either case, a rotatable actuating shaft 120—either directly connected with, and being part of, the adjustable element 18 as shown in the drawing or being indirectly connected therewith, e.g. by a rigid or flexible intermediate connecting shaft member—extends into the lower receiving end of mounting hub 11 so that end portion 130 of this shaft 120 can be coupled or meshed with a recessed or hollow shaft member 14 that is connected with the external knob 13 and is free-wheeling or freely turning or idling together with the latter when the adjusting device is not actuated by manual pressure. For operating the adjusting device, knob 13 is manually pressed in the direction of arrow A against the pressure of push-off spring 15 and thus moves shaft member 14 towards the adjacent end of actuating shaft 120.

For clutchingly or meshingly connecting shaft member 14 with the actuating shaft 120, the interior end portion 101 of the hollow shaft member 14 is provided with a clutch face for instance containing an inner cone 104, i.e. a recess with an inside taper, so that a temporary clutching resulting from pressing knob 13 in the direction of arrow A until the inner cone 104 engages with the end portion 130 of shaft 120 will be released immediately when the manual pressure stops and spring 15 is free to disengage shaft 14 from the clutching position. As long as knob 13 is not manually pressed into clutching engagement of cone 104 with end 130 of shaft 120, knob 13 plus shaft 14 can be rotated freely, i.e. is in an idling or so-called free-wheeling, i.e. freely turning position, and an accidental change of the setting of element 18 is precluded.

Preferably, shaft 14 is structured as a clutching sleeve as shown in the drawing and is relatively long, e.g. at least twice as long as its outer diameter. Further, shaft 14 preferably is slidingly guided for a substantial part of its length, e.g. for at least about 75% of its length, by the interior wall or boring of the mounting hub 11 in the outer (from the instrument) and protruding end portion thereof. A stop or shoulder 150 is provided at the outer surface of the coupling end portion 101 of the shaft or coupling sleeve 14 to engage with a correspondingly shaped shoulder portion at the inner wall of hub 11.

Seal 12 between the inner side of knob 13 and the outer surface of hub 11 near the open end of knob 13 serves to prevent penetration of water or other contaminants into the interior portions of mounting hub 11 and thus into the interior of the housing encompassed by wall or panel 110 and into element 18.

The sliding yet sealed contact between the inner portion or recess of knob 13 and the external (from the instrument) end of mounting hub 11 has been found to be an effective sealing means for an adjusting device having a simple yet operatively effective structure. Preferably, seal 12 is an annular seal of the O-ring type arranged in a recess of the interior wall portion of knob 13 as shown in the drawing. Generally, knob 13 can be said to have the shape of a hollow capsule having an open end for sliding movement along the exterior wall of hub 11. The O-ring seal 12 is moved together with knob 13 when the latter is pressed towards panel 110 for clutching engagement of cone 104 and end portion 130 of shaft 120 and turned for setting the element 18 by rotation of shaft 120.

Suitable O-rings for seal 12 (and seal 16) consisting of a generally elastomeric material, such as synthetic or modified natural rubber-type polymers, with fillers, stabilizers and other additives are available commercially and proper selection of suitably dimensioned O-rings is a matter well within the competence of the expert so that a more detailed discussion is not required here.

In general, the diameter of seal 12 is kept as small as possible in order to obtain a desirable low sealing friction. Further, it is preferred for mobility of knob 13 and shaft 14 in axial direction if the ratio of the guided length of shaft 14 in the form of a clutching sleeve to the inner diameter of ring seal 12 is at least 1:1.

The threaded socket 181 of the adjustable element 18, that is preferably connected directly with hub 11 at the end thereof opposite from knob 13, such as by screwing into the inner thread 182, also serves to set or adjust the desired pressure between contacting spring 15 and clutching sleeve 14. For that purpose, lock-nut 19 is disconnected and the thread socket is displaced by turning until the desired spring action that determines the actuating pressure or manual force required for clutching is achieved. A force in the range of 100 to 1000 grams is suitable for most purposes. After adjustment of the desired operating pressure, lock-nut 19 is screwed on to lock socket 181 in its position within thread 182. Also, such controllable displacement of element 18 with its rotatable adjustment shaft 120 within mounting hub 11 will determine the clearance or tolerance of the clutching elements 104, 130.

Knob 13 can be provided with a knurled head having external ribs or grooves. Preferably, knob 13 is provided with a plug or pin portion 135 for a clamping or press-fitting connection within bore 160 of shaft 14.

For sealingly mounting the adjusting device in the wall or panel 110 of an instrument box or the like, mounting hub 11 is provided with threaded outer portion 170 for interaction with nut 17.

Preferably, mounting hub 11 is made of a corrosion resistant metal. The rotatable components of the adjusting device and notably knob 13 and shaft 14 interconnected with knob 13 and freely turnable together with the latter can be made with advantage of a polymer composition (thermoplastic or duroplastic) having a low friction on a metal surface. Spring 15 preferably is made of stainless steel. Generally, selection of suitable materials for optimization of the inventive adjusting device in view of function, production and costs is within the expert's competence as is the desired electrical connection of the adjustable element 18 with the other components of a measuring or monitoring instrument.

The device according to the invention is particularly suited for adjustment settings, e.g. calibration or zero-adjustment, of instruments for measuring or monitoring of liquid or gaseous media, such as air or water, for example for measuring the oxygen ($O_2$) concentration of a flowing or stationary body of water by means of portable or stationary instruments that are exposed to severe ambient conditions.

While there are shown and described present preferred embodiments of the invention, it is to be distinctly understood that the invention is not limited thereto, but may be otherwise variously embodied and practiced within the scope of the following claims. ACCORDINGLY,

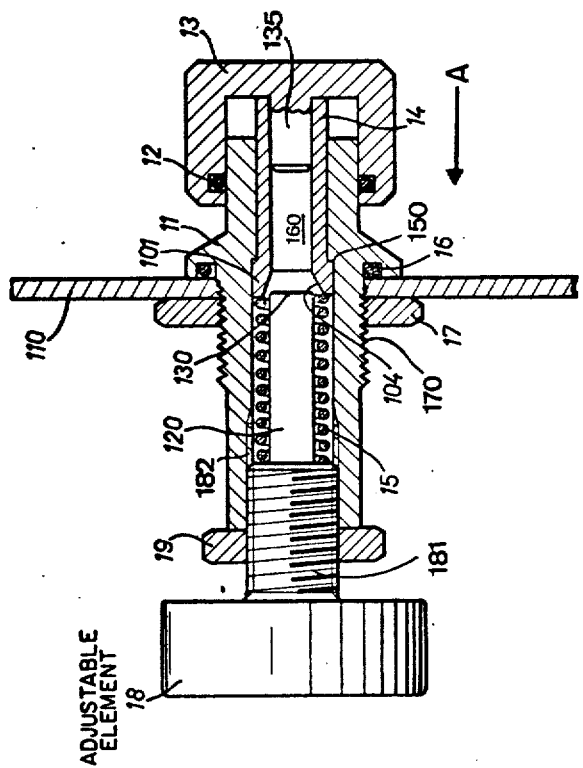

What I claim is:

1. An adjusting device comprising a normally freely turnable adjusting knob capable of temporary actuation for changing the setting of an adjustable element, a stationary mounting hub, said adjusting knob being formed as a hollow capsule rotatably arranged around and receiving one end of said stationary mounting hub, sealing means between an inner side of said knob and said mounting hub and located near an open end of said knob so as to protect the interior of said mounting hub from penetration of water and contaminants, a normally disengaged clutch means provided within said mounting hub and connected with said knob for temporary engagement of said knob and said adjustable element, a spring arranged within said mounting hub engaging a freely turnable hollow shaft, said shaft being connected with said knob, said clutch means being actuated when said knob is pressed against said spring, an actuating shaft provided for said adjustable element, said clutch means comprising said normally freely turnable shaft, one end of which is connected with said knob and the other end of which is provided with a clutch face for temporary engagement with said actuating shaft, said actuating shaft extending into said mounting hub at an end thereof opposite said one end of said mounting hub received in said knob.

2. The device of claim 1, wherein said clutch face of said normally freely turnable shaft comprises a hollow cone in the form of a tapered recess.

3. The device of claim 2, wherein said actuating shaft is provided with an end portion capable of disengageable coupling with said clutch face.

4. The device of claim 1, wherein, said spring is arranged to act upon and press against said normally freely turnable shaft for maintaining the latter together with said knob in a normally freely rotatable position and to disengage said clutch means when said knob is not pressed against said spring.

5. The device of claim 1, wherein said mounting hub is provided with means for receiving and holding a portion of said adjustable element and means for sealingly connecting said mounting hub with a wall portion of an instrument housing.

* * * * *

UNITED STATES PATENT AND TRADEMARK OFFICE
CERTIFICATE OF CORRECTION

PATENT NO. : 4,153,149
DATED : May 8, 1979
INVENTOR(S) : Eugene Weber

It is certified that error appears in the above-identified patent and that said Letters Patent are hereby corrected as shown below:

On the Title Page the drawing should appear as shown on the attached sheet.

Signed and Sealed this

Eighteenth Day of September 1979

[SEAL]

Attest:

Attesting Officer

LUTRELLE F. PARKER
*Acting Commissioner of Patents and Trademarks*

UNITED STATES PATENT AND TRADEMARK OFFICE
CERTIFICATE OF CORRECTION

PATENT NO. : 4,153,149

DATED : May 8, 1979

INVENTOR(S) : Eugene Weber

Page 2 of 2

It is certified that error appears in the above-identified patent and that said Letters Patent are hereby corrected as shown below: